United States Patent
Ng et al.

(10) Patent No.: US 10,094,015 B2
(45) Date of Patent: Oct. 9, 2018

(54) PROTECTIVE LAYER FOR A MAGNETIC RECORDING MEDIUM, AND A METHOD OF MANUFACTURING THE SAME

(71) Applicant: FUJI ELECTRIC (MALAYSIA) SDN, BHD., Kulim (MY)

(72) Inventors: Wah Lawrence Ng, Kulim (MY); Se Yong Eh Noum, Kulim (MY); Mun Sing Fan, Kulim (MY); Wee Shen Khoo, Kulim (MY); Naruhisa Nagata, Nagano (JP)

(73) Assignee: FUJI ELECTRIC (MALAYSIA) SDN, BHD., Kulim (MY)

(*) Notice: Subject to any disclaimer, the term of this patent is extended or adjusted under 35 U.S.C. 154(b) by 0 days.

(21) Appl. No.: 14/330,647

(22) Filed: Jul. 14, 2014

(65) Prior Publication Data

US 2015/0275352 A1    Oct. 1, 2015

(30) Foreign Application Priority Data

Mar. 25, 2014 (MY) ................ PI 2014000875

(51) Int. Cl.
| | | |
|---|---|---|
| G11B 5/66 | (2006.01) |
| C23C 14/32 | (2006.01) |
| G11B 5/72 | (2006.01) |
| C23C 14/06 | (2006.01) |
| G11B 5/84 | (2006.01) |
| C23C 14/58 | (2006.01) |

(52) U.S. Cl.
CPC ........ C23C 14/325 (2013.01); C23C 14/0605 (2013.01); C23C 14/586 (2013.01); G11B 5/72 (2013.01); G11B 5/8408 (2013.01)

(58) Field of Classification Search
CPC . C23C 14/325; C23C 14/0605; C23C 14/586; G11B 5/8408
See application file for complete search history.

(56) References Cited

U.S. PATENT DOCUMENTS

| | | |
|---|---|---|
| 4,664,976 A | 5/1987 | Kimura et al. |
| 6,031,239 A | 2/2000 | Shi et al. |
| 6,537,668 B1 | 3/2003 | Vijayen et al. |
| 6,537,686 B1 | 3/2003 | Chen |
| 6,613,422 B1* | 9/2003 | Ma ......................... G11B 5/72 428/212 |
| 7,175,926 B2 | 2/2007 | Ma et al. |
| 7,604,881 B2 | 10/2009 | Veerasamy et al. |

(Continued)

FOREIGN PATENT DOCUMENTS

| | | |
|---|---|---|
| JP | 57-167133 A | 10/1982 |
| JP | 2003-223710 A | 8/2003 |
| WO | WO 00-72315 A1 | 11/2000 |

OTHER PUBLICATIONS

WAng et al., Thin Solid Films, 377-378, (Jan. 2000) 280-284.*
Singaporean Search Report dated Jun. 9, 2015.

*Primary Examiner* — Holly C Rickman
(74) *Attorney, Agent, or Firm* — Rabin & Berdo, P.C.

(57) ABSTRACT

A method for making a magnetic recording medium, including providing a substrate, forming a magnetic layer on the substrate, applying filtered cathodic vacuum arc (FCVA) deposition to form a film on the magnetic layer, and performing nitridation on the film formed by the FCVA deposition.

12 Claims, 8 Drawing Sheets

(56) References Cited

U.S. PATENT DOCUMENTS

| | | | |
|---|---|---|---|
| 8,947,826 B2* | 2/2015 | Bhatia | C23C 14/48 360/122 |
| 9,047,905 B2 | 6/2015 | Katano et al. | |
| 2007/0098980 A1* | 5/2007 | Vijayen | C03C 17/22 428/336 |
| 2010/0086808 A1 | 4/2010 | Nagata | |
| 2013/0034746 A1* | 2/2013 | Katano | G11B 5/72 428/833.2 |
| 2014/0065445 A1 | 3/2014 | Katano et al. | |

* cited by examiner

PROTECTIVE LAYER FOR A MAGNETIC RECORDING MEDIUM, AND A METHOD OF MANUFACTURING THE SAME

BACKGROUND

1. Technical Field

The present invention relates to the production and improvement of a protective layer of a magnetic disk medium, and in particular, relates to a carbon-based protective layer for a magnetic recording medium and a method for forming the protective layer.

2. Background Information

Magnetic recording media are widely used to provide large-capacity data storage. A magnetic recording medium is generally made of a substrate, a magnetic recording layer and other layers (e.g. soft magnetic backing layer, nonmagnetic intermediate layer, etc.) disposed on the substrate, and a protective layer formed thereon. A lubricate layer may be further formed on the protective layer. The protective layer typically has high wear resistance to withstand the rubbing contact with a magnetic head during operations of the recording medium. It also has high corrosion resistance to prevent the underlying magnetic recording layer from corrosion.

To enhance the recording density and increase the storage capacity of a magnetic recording medium, it is often necessary to decrease the spacing between a magnetic head and the magnetic recording medium when the medium is accessed by the magnetic head—this requires not only a reduction in the flying height of the magnetic head but also a decrease in the thickness of the protective layer of the recording medium. As an example, a carbon-based protective layer of a magnetic recording medium may have a thickness of about 2 nm when it is formed by a PECVD (Plasma-Enhanced Chemical Vapor Deposition) process.

However, when the thickness of the protective layer of the recording medium is reduced, it is often difficult to maintain mechanical durability and weatherability of the recording medium, and to prevent the occurrence of bit errors caused by magnetic corrosion. Thus, it is desirable to form on a magnetic recording medium a thin protective layer that still has high wear and corrosion resistance, so that a magnetic head can fly smoothly over and closely to the magnetic recording medium, to thereby increase the recording density of the recording medium and improve the data transfer speed therebetween.

SUMMARY

The invention relates to a method for making a magnetic recording medium, including providing a substrate, forming a magnetic layer on the substrate, applying filtered cathodic vacuum arc (FCVA) deposition to form a film on the magnetic layer, and performing nitridation on the film formed by the FCVA deposition.

DETAILED DESCRIPTION

The invention will now be described in more detail by way of example with reference to the embodiments shown in the accompanying Figures. It should be kept in mind that the following described embodiments are only presented by way of example and should not be construed as limiting the inventive concept to any particular physical configuration. Further, if used and unless otherwise stated, the terms "upper," "lower," "front," "back," "over," "under," and similar such terms are not to be construed as limiting the invention to a particular orientation. Instead, these terms are used only on a relative basis.

The invention relates to a protective layer of a magnetic recording medium and a method for forming such a protective layer. The protective layer is formed by an FCVA deposition method followed by a nitrogen treatment.

Figure 1:
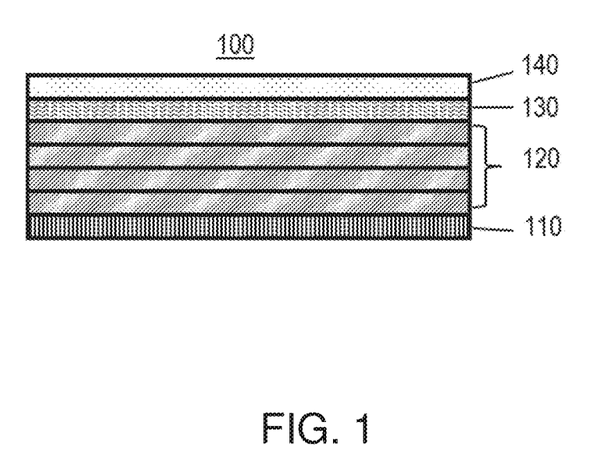
FIG. 1 illustrates a magnetic recording medium with a protective layer manufactured according to one embodiment of the invention.
Figure 2:
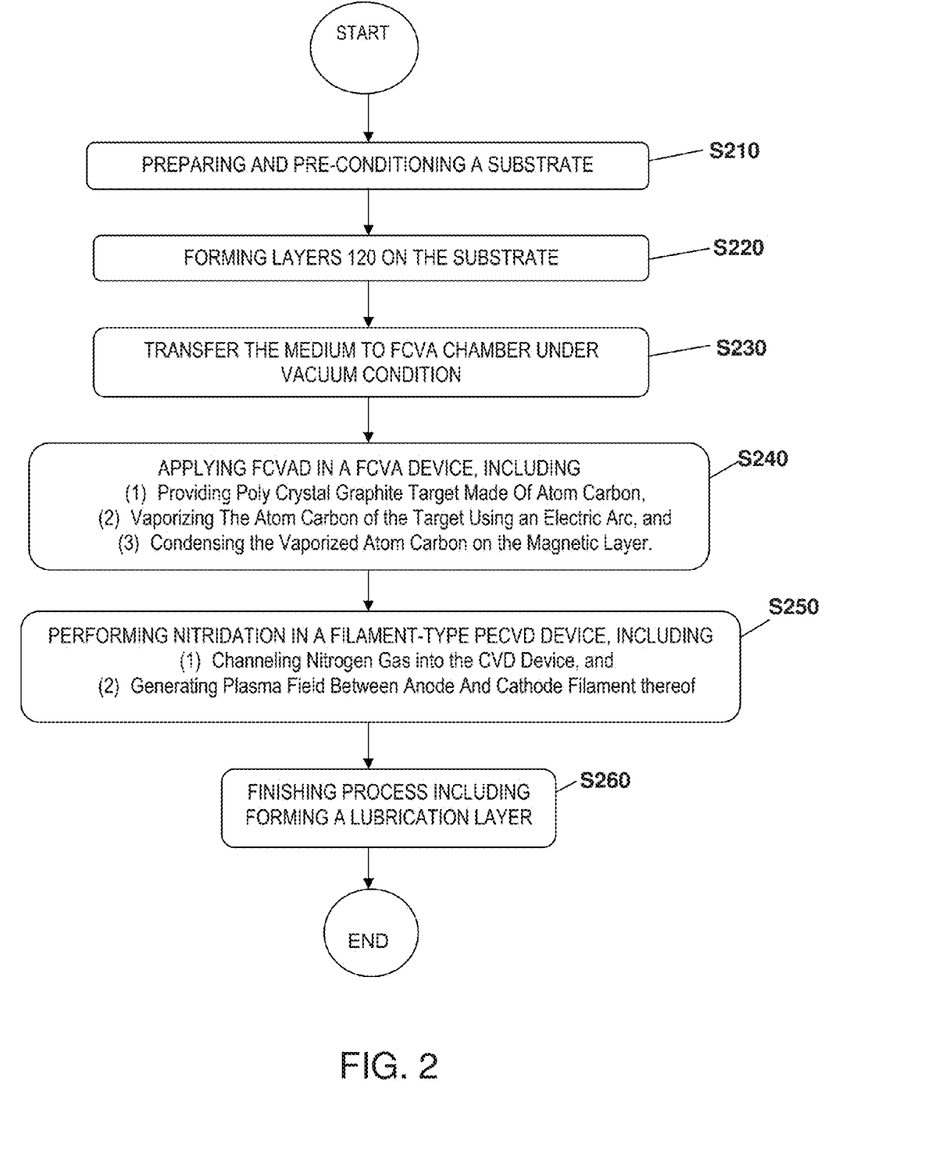
FIG. 2 is a flowchart illustrating a protective layer forming process in one embodiment of the invention.
Figure 3:
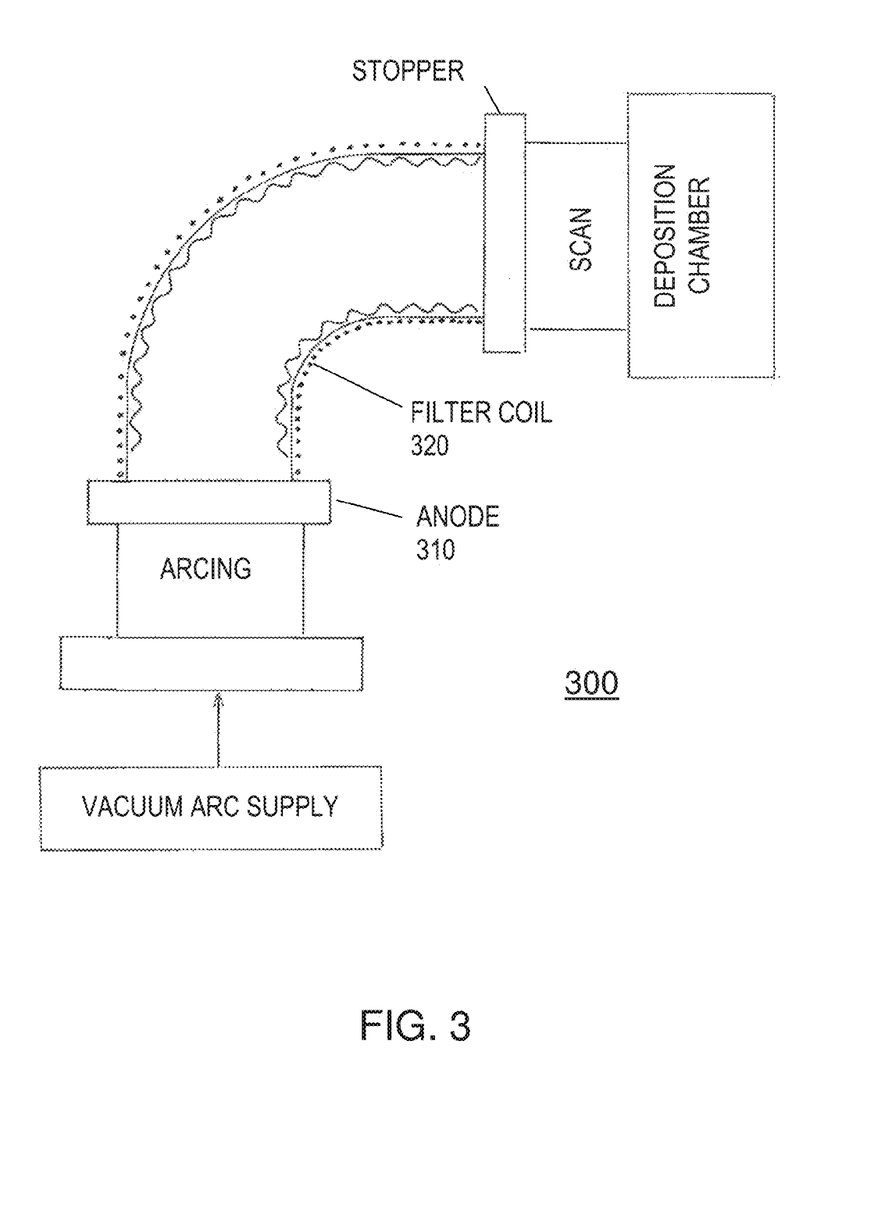
FIG. 3 shows a Filtered Cathodic Vacuum Arc (FCVA) device used in one embodiment of the invention to manufacture the protective layer.
Figure 4:
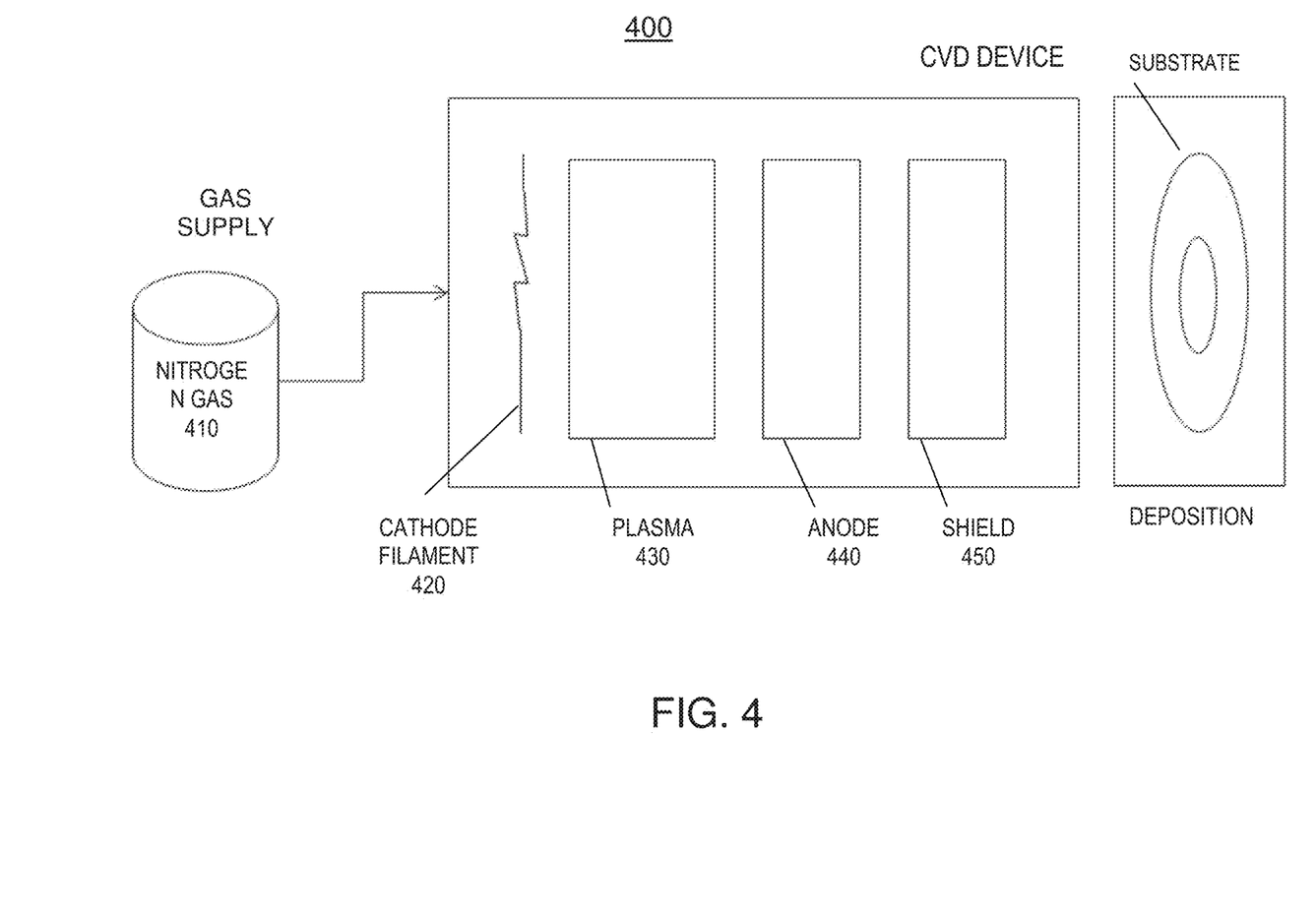
FIG. 4 shows a filament-type plasma-enhanced chemical vapor deposition (PECVD) device used in one embodiment of the invention to manufacture the protective layer.

FIG. 1 illustrates a magnetic recording medium with a protective layer manufactured according to one embodiment of the invention. FIG. 2 is a flowchart illustrating a protective layer forming process in one embodiment of the invention. FIG. 3 shows a Filtered Cathodic Vacuum Arc (FCVA) device used in one embodiment of the invention to manufacture the protective layer. FIG. 4 shows a filament-type plasma-enhanced chemical vapor deposition (PECVD) device used in one embodiment of the invention to manufacture the protective layer.

In one embodiment of the invention, the magnetic recording medium is formed by using an aluminum substrate 110 with a diameter of 95 mm and a thickness of 1.25 mm (FIG. 2, S210). The substrate 110 is pre-conditioned with NiP via a plating process (S210). Subsequently, an underlayer made of CoFeZrTaNb and having a thickness of 36 nm, an intermediate layer made of Ruthenium and having a thickness of 10 nm, and a magnetic layer made of CoCrPtRu—SiO2-TiO2 and having a thickness of 16 nm are deposited consecutively on the substrate 110 (S220; the underlayer, the intermediate layer and the magnetic layer are collectively shown as layers 120 in FIG. 1). Other materials and other thicknesses may also be used to make the layers 120, as may be contemplated by one skilled in the art. Other layers may also be formed underneath or between the underlayer, the intermediate layer and the magnetic layer.

Immediately after the magnetic layer deposition is accomplished in a magnetic chamber, the substrate 110, with the layers 120 formed thereon, is transferred to an FCVA chamber 300 next to the magnetic chamber under a vacuum condition (S230). In the FCVA chamber 300, a FCVA deposition method is applied to form a thin film (e.g. layer 130 in FIG. 1) on the magnetic layer (S240). In the FCVA deposition method, an electric arc is used to vaporize material from a cathode target, and the vaporized material then condenses on a substrate, to thereby form a thin film. In one embodiment, a cylindrical-shaped poly crystal graphite target made of atom carbon is used in the FCVA chamber 300. Voltages of 5 V and 15 V are respectively supplied to the anode 310 and the filter coil 320 of the FCVA device 300, and an arc current of 50 A is supplied to arc the graphite target, and the substrate voltage is floated. By adjusting the deposition time, a carbon thin film can be formed to a desired thickness (e.g. 2.0 nm, 1.5 nm or 1.0 nm). As an example, a FCVA device 300 similar to the one described in U.S. Pat. No. 6,031,239 may be used to form the thin film.

Figure 8:
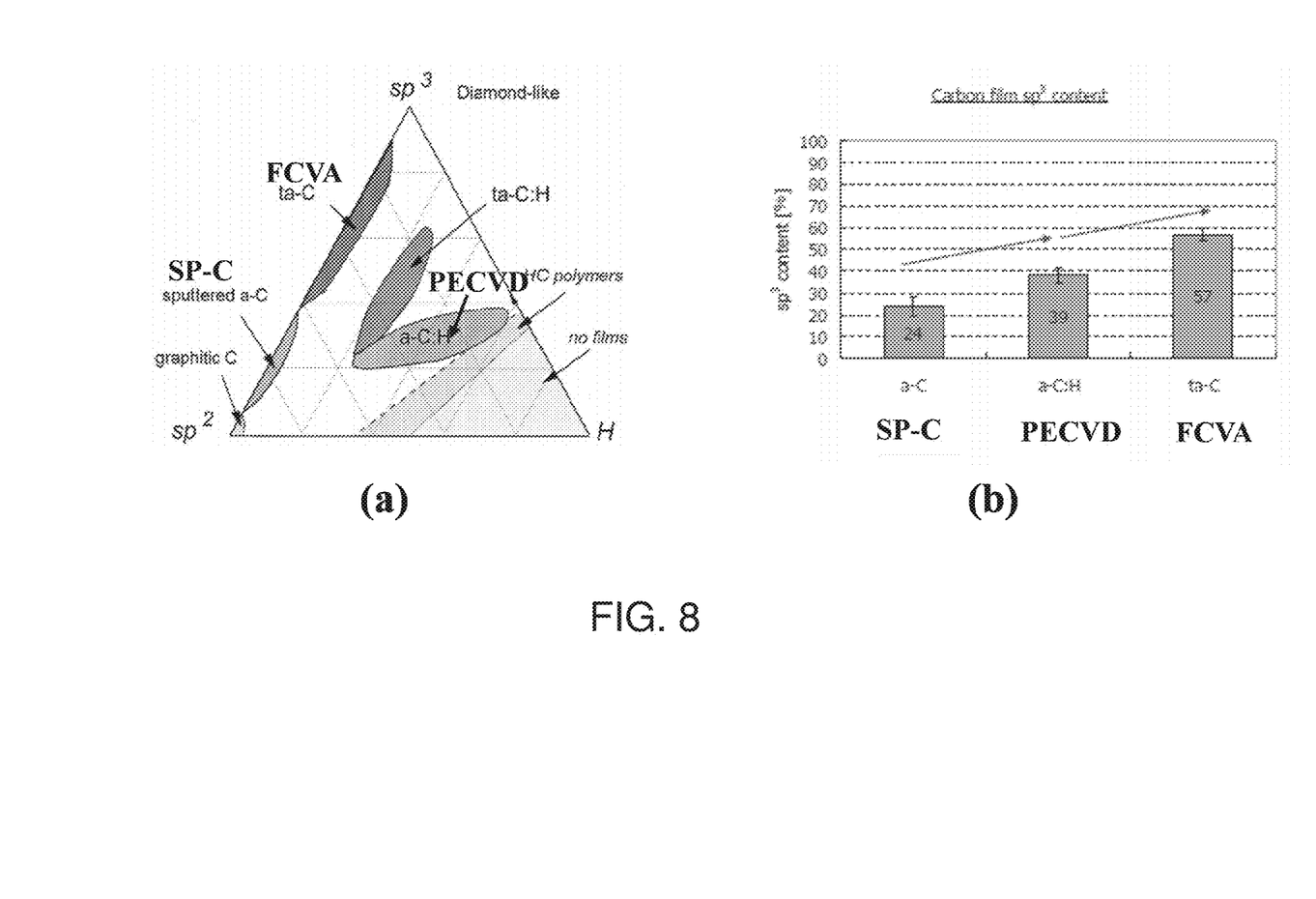
FIG. 8 illustrates the differences between a thin film formed in the FCVA chamber 300 and one formed in a conventional PECVD and sputtering process.

A thin film so formed in the FCVA chamber 300 differs from a thin film that may be formed in a conventional PECVD process. For example, the $sp^3$ content of a carbon thin film formed in the FCVA chamber 300 is of a much higher percentage than that of a carbon thin film formed by conventional PECVD and sputter processes. FIG. 8 illustrates the differences between a thin film formed in the FCVA chamber 300 and the thin films formed in a conventional PECVD process and in a sputtering process (i.e. SP-C). The sputtered carbon (SP-C) is formed from magnetron sputtering of graphite in an Ar atmosphere. For a-C:H (amorphous hydrogenated carbon), a PECVD system 400 is used with hydrocarbon gas instead of nitrogen gas as the precursor for the carbon film formation. An Electron Spectroscopy Chemical Analysis (ESCA) machine is used to determine the $sp^3$ content. The ESCA uses diamond and highly ordered pyrolytic graphite (HOPG) as calibration samples with $sp^3$=100% and $sp^2$=100%, respectively. Automatic curve fitting of an integrated area method is applied to get the appropriate results for $sp^2$ and $sp^3$ peak positions using a combination of Gaussian function and Lorentzian function. The $sp^3$ content is defined as the percentage of the amount of $sp^3$ with respect to the total amount of $sp^2$ and $sp^3$. In FIG. 8, "a-C" means "amorphous carbon," and "ta-C' stands for "tetrahedral amorphous carbon"; "a-C:H" means "amorphous hydrogenated carbon," and "ta-C:H" stands for "tetrahedral amorphous carbon containing hydrogen"; and "HC polymers" stands for "HydroCarbon polymers." The arrows in (b) of FIG. 8 signify the increase in the $sp^3$ content.

In one embodiment of the invention, after the FCVA deposition performed in the FCVA chamber 300, the medium is moved to another chamber equipped with a filament-type PECVD device 400, that is, a PECVD chamber. A nitridation process is performed in this chamber, where a plasma field 430 is generated when a hot filament 420 generates electrons, and the electrons chemically decompose nitrogen gas 410 (S250). The decomposed nitrogen gas will pass through a shield 450 (stainless steel 303) designed to trap any particle created during the plasma process, which mostly comes from the coating on the plasma chamber 430. That is, the carbon protective layer is treated by nitrogen atoms, and the nitrogen treatment is done by a PECVD technique where nitrogen gas with a flow rate of 2~50 sccm is applied and bombarded towards the medium by applying a bias. In one embodiment, the nitrogen gas 410 is channeled into the chamber with a flow rate of around 50 sccm (standard cubic centimeters per minute) controlled by a mass flow controller (MFC, not shown in FIG. 4). A DC power of 40 V is supplied between the cathode filament 420 and the anode 440. The bias voltage of −40 V (relative to the ground potential) is applied on the media transferred from FCVA chamber 300 for 2 seconds to start the nitridation process. A pressure of the nitrogen gas is around 0.67 Pa, and is preferably under 2 Pa. Preferred nitrogen concentration is about 15-17% at the outermost surface of the medium (In the embodiment, this atomic weight % of nitrogen atom is determined using the ESCA machine: the percentage is based on three components of carbon, nitrogen and oxygen; and the measurement was done on the outmost surface of the FCVA-carbon layer). The so formed nitridated carbon protective layer may have a thickness of 1 to 2 nm.

The nitrogen gas-treated media is then treated by a finishing process including lubrication (S260). The media is dip-coated in a lubricant bath consisted of a perfluoropolyether-type lubricant to form a lubricant layer 140. The thickness of the lubricant layer 140 can be controlled by using different drain speeds and different lubricant concentrations. For example, a thickness of 9 Å, as measured by Fourier transform infrared spectroscopy (FTIR) spectroscopy, can be obtained through this process.

The durability of a protective layer 130 formed in the invention can be measured in two ways. One way to check the durability of the protective layer is a "Pin on Disk" test. In this test, a fixed pin with a spherical top (or, a round ball of a predetermined weight) is placed on top of, and in contact with, the surface of a rotating disk, and the friction therebetween is measured by a stress detector. The friction coefficient will remain relatively constant at an initial stage when the protective layer is not compromised, but as soon as the layer is compromise, a spike will be detected. Thus, the number of rotations completed before the detection of the friction coefficient spike (i.e. the "breaking point") is recorded and used as an indication of durability—a disk is deemed to have a higher durability if the number of rotations is higher.

Figure 5:
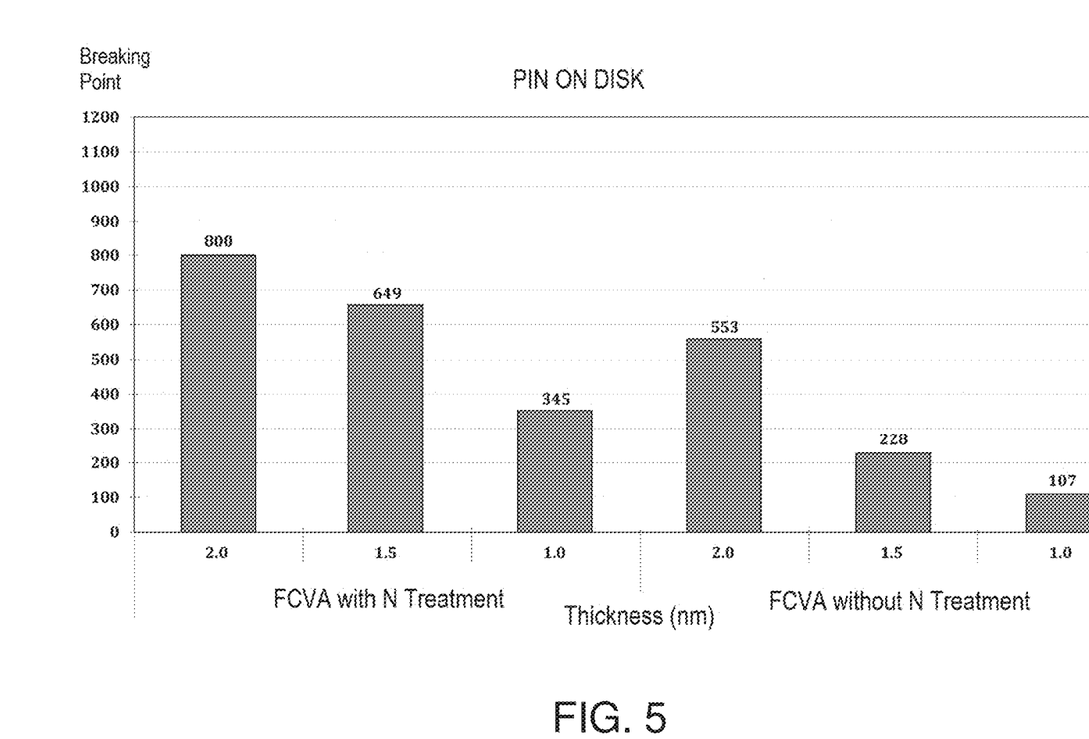
FIG. 5 shows results of the "Pin on Disk" test for protective layers formed by one embodiment of the invention.

FIG. 5 shows results of the "Pin on Disk" test for various protective layers 130 formed by one embodiment of the invention (i.e. FCVA carbon films with nitrogen treatment). As a comparison, test results for FCVA carbon films formed without the nitrogen treatment are also shown in FIG. 5. The numbers under the bar indicate the carbon film thickness of each sample. FIG. 5 corresponds to a test in which a load of 30 g and a linear velocity of 24 cm/sec are applied. As the results in FIG. 5 show, the breaking point for each nitrogen-treated FCVA carbon film 130 is higher than that for an untreated FCVA carbon film having the same thickness. Thus, the nitrogen treatment may greatly improve the durability of a carbon film formed via FCVA deposition.

The other way to measure the durability of the protective layer formed on a magnetic recording medium is the "Altitude Drag" test (or A-drag test). In this test, a magnetic head is dragged on the surface of the medium, where the medium and the head are both enclosed into a vacuum. An acoustic emission sensor is installed on a stage arm used to mount the magnetic head, and is used to detect an electrical signal spike when the surface of the medium is compromised. The number of completed rotations before the occurrence of the spike (shown as "kPass" in FIGS. 6 and 7) is recorded and used as an indication of durability—a magnetic recording media is deeming to have a higher durability if the number of complete rotations is higher.

Figure 6:
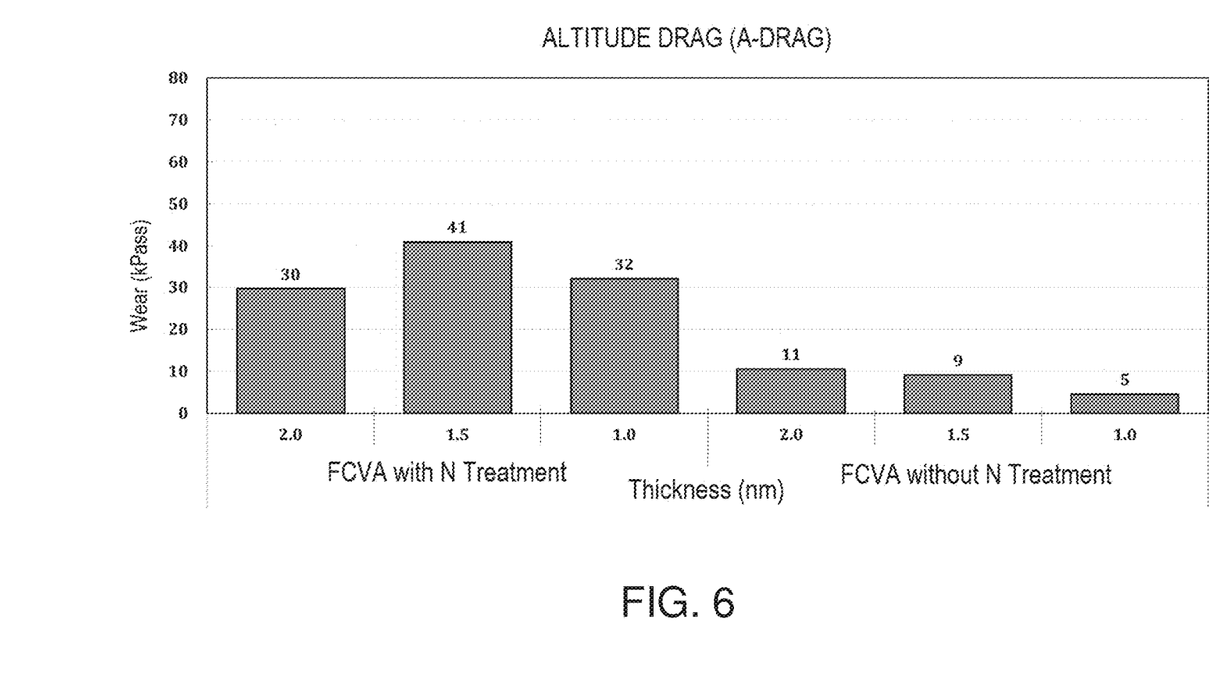
FIG. 6 shows results of the "A-Drag" test for protective layers formed by one embodiment of the invention.

FIG. 6 shows results of the "A-Drag" test for various protective layers 130 formed by one embodiment of the invention (i.e. FCVA carbon films with nitrogen treatment). As a comparison, test results for FCVA carbon films formed without the nitrogen treatment are also shown in FIG. 6. The numbers under the bar indicate the carbon film thickness of each sample. As the results in FIG. 6 show, the "kPass" for each nitrogen-treated FCVA carbon film 130 is higher than that for an untreated FCVA carbon film having the same thickness. Thus, the nitrogen treatment may greatly improve the durability of a carbon film formed via FCVA deposition.

Figure 7:
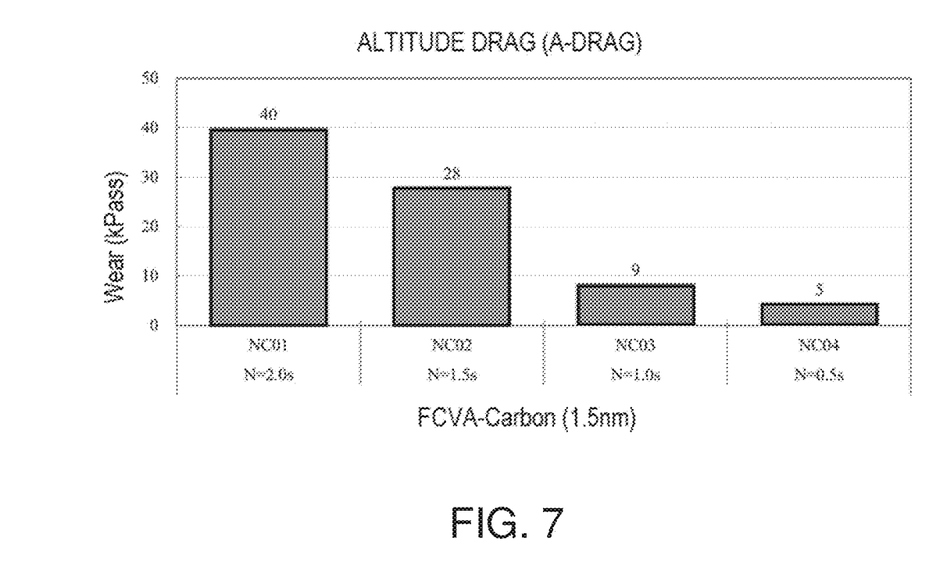
FIG. 7 shows results of the "A-Drag" test for different FCVA carbon films that are nitrogen-treated with different durations of time.

FIG. 7 shows results of the "A-Drag" test for various FCVA carbon films that are nitrogen-treated with different durations of time. The FCVA carbon films in FIG. 7 have the same thickness, but are treated respectively for 0.5 seconds, 1 second, 1.5 seconds and 2 seconds by the nitrogen plasma. The numbers under the bar next to "N=" indicate the duration of time for each sample. The results show that the durability of the protective layer increases with the length of time used for nitrogen treatment. It is believed that longer treatment duration may help create more uniform doping of nitrogen atoms on an FCVA-carbon surface.

This invention relates to a protective layer that is formed by an FCVA deposition method followed by a nitrogen treatment. Due to the inert nature of the FCVA carbon film, a lubricant layer may normally have difficulty bonding with the FCVA carbon layer. Thus, the bonded ratio of an FCVA carbon layer is normally lower than those deposited by other methods. Bonded ratio is defined as the percentage of the thickness of non-removable lubricant layer with respect to the thickness of a total lubricant layer that includes both a mobile lubricant layer and the non-removable lubricant layer. The thickness of the non-removable lubricant layer is gained after the medium is dipped in a fluorine-based solvent. As illustrated in FIG. 8, the $sp^3$ content of the FCVA deposited protective layer is around 50% higher than that of a PECVD protective layer. In other words, the FCVA carbon protective layer resembles a diamond structure (allotrope of carbon, see FIG. 8 (a)), in which four valence electrons of each carbon atom participate in the formation of very strong covalent bonds, and there are no free electrons to have interaction with a hydroxyl ending group from the lubricant. In contrast, a PECVD protective layer has higher $sp^2$ content resembling a graphite structure (allotrope of carbon, see FIG. 8(a)). In the graphite structure, three of four electrons participate in forming strong covalent bonds with their adjacent atoms in a hexagonal ring structure. The fourth electron is free to move over the surface of the graphite structure, causing the graphite structure to interact with another material, such as the hydroxyl group from the lubricant through a covalent bonding (a covalent bond is a type of chemical bond in which electrons are shared between atoms). As such, lubricants may spin off easily from the magnetic recording medium at a spinning speed of 5000 rpm to 10000 rpm, which can destroy the operating environment requirement of the hard disk drive, if the FCVA deposition is applied without any additional treatment. This invention describes a method of nitridation on a top most surface of the FCVA carbon layer, without the need of forming dual FCVA carbon layers. Additional advantages and aspects of this invention will become obvious to those skilled in this art.

It should be understood, that the invention is not necessarily limited to the specific process, arrangement, materials and components shown and described above, but may be susceptible to numerous variations within the scope of the invention.

What is claimed is:

1. A method for making a magnetic recording medium, comprising:
    providing a substrate;
    forming a magnetic layer on the substrate in a first chamber;
    moving the substrate having the magnetic layer formed thereon to a second chamber that is different from the first chamber; and
    applying, in the second chamber, filtered cathodic vacuum arc (FCVA) deposition to form a tetrahedral amorphous carbon film on the magnetic layer;
    moving the substrate that has the magnetic layer with the tetrahedral amorphous carbon film formed thereon to a third chamber that is different from the first and second chambers; and
    performing nitridation in the third chamber by treating the tetrahedral amorphous carbon film, formed in the second chamber by the FCVA deposition, with nitrogen atoms, to thereby form a nitridated carbon protective layer that has a nitrogen concentration of 15%~17% at an outmost surface thereof.

2. The method of claim 1, further comprising performing, after the nitridation, a finishing process that includes forming a lubrication layer on the nitridated film.

3. The method of claim 1, wherein the applying FCVA deposition includes:
    providing a poly crystal graphite target made of atom carbon;
    vaporizing the atom carbon of the target using an electric arc; and
    condensing the vaporized atom carbon on the magnetic layer to form the film.

4. The method of claim 1, wherein the applying FCVA deposition includes adjusting a time of the FCVA application to thereby adjust a thickness of the film.

5. The method of claim 1, wherein
    the third chamber is a filament-type plasma-enhanced chemical vapor deposition (PECVD) device; and
    the performing nitridation includes:
        channeling nitrogen gas into the PECVD device; and
        generating a plasma field between an anode and a cathode filament of the PECVD device.

6. The method of claim 5, wherein the nitrogen gas is channeled into the PECVD device at a flow rate of 50 sccm.

7. The method of claim 1, wherein
    the second chamber is an FCVA device; and
    the method further includes, immediately after the formation of the magnetic layer and before applying the FCVA deposition, transferring the substrate with the magnetic layer formed thereon to the FCVA device under a vacuum condition.

8. A method for forming a protective layer of a magnetic recording medium, the magnetic recording medium having a magnetic layer, the method comprising:
    applying, in a chamber, filtered cathodic vacuum arc (FCVA) deposition to form a tetrahedral amorphous carbon film on the magnetic layer;
    moving the magnetic recording medium of which the magnetic layer has the tetrahedral amorphous carbon film formed thereon to another chamber, which is different from the chamber in which the FCVA deposition is applied; and
    performing nitridation in said another chamber by treating the tetrahedral amorphous carbon film, formed by the FCVA deposition, with nitrogen atoms, to thereby form the protective layer that is a nitridated carbon protective layer having a nitrogen concentration of 15%~17% at an outmost surface thereof.

9. The method of claim 8, wherein the applying FCVA deposition includes:
    providing a poly crystal graphite target made of atom carbon;
    vaporizing the atom carbon of the target using an electric arc; and
    condensing the vaporized atom carbon on the magnetic layer to form the film.

10. The method of claim 8, wherein
said another chamber is a filament-type plasma-enhanced chemical vapor deposition (PECVD) device; and
the performing nitridation includes:
 channeling nitrogen gas into the PECVD device; and
 generating a plasma field between an anode and a cathode filament of the PECVD device.

11. The method of claim 1, wherein the treating the tetrahedral amorphous carbon film includes treating the tetrahedral amorphous carbon film using plasma made of nitrogen gas.

12. The method of claim 8, wherein the treating the tetrahedral amorphous carbon film includes treating the tetrahedral amorphous carbon film using plasma made of nitrogen gas.

\* \* \* \* \*